United States Patent [19]
Ping et al.

[11] Patent Number: 5,610,081
[45] Date of Patent: Mar. 11, 1997

[54] INTEGRATED CIRCUIT MODULE FIXING METHOD FOR TEMPERATURE CYCLING TEST

[75] Inventors: King-Ho Ping, Tainan; Jin-Yuan Lee, Hsin-Chu, both of Taiwan

[73] Assignee: Taiwan Semiconductor Manufacturing Company, Ltd, Hsin-Chu, Taiwan

[21] Appl. No.: 658,525

[22] Filed: Jun. 3, 1996

[51] Int. Cl.$^6$ .......................... H01L 21/66; B65D 73/02; F27D 5/00; G01R 31/26

[52] U.S. Cl. .............................. 437/8; 437/248; 206/710; 414/222; 432/253

[58] Field of Search ................................ 437/8, 247, 248; 414/150, 160, 222, 586; 219/416; 206/710, 711, 712; 432/153, 253

[56] References Cited

U.S. PATENT DOCUMENTS

| | | | |
|---|---|---|---|
| 3,892,520 | 7/1975 | Masujima et al. | 432/253 |
| 4,815,912 | 3/1989 | Maney et al. | 414/222 |
| 4,966,549 | 10/1990 | Ohdate | 432/253 |
| 5,368,466 | 11/1994 | Hehl | 414/222 |
| 5,452,795 | 9/1995 | Gallagher et al. | 206/711 |
| 5,549,205 | 8/1996 | Doche | 206/710 |

*Primary Examiner*—John Niebling
*Assistant Examiner*—Brian K. Dutton
*Attorney, Agent, or Firm*—George O. Saile

[57] ABSTRACT

An apparatus to retain integrated circuit modules during the preparation for a cycling of temperature, during the cycling of temperature, and during the post-handling after the cycling of temperature, is described. The apparatus has a specimen basket to contain the integrated circuit modules, a plurality of specimen retaining rods coupled to the specimen basket to prevent the integrated circuit modules from movement within the basket, a plurality of integrated circuit module retaining means coupled to the specimen retaining rods to secure each of the integrated circuit modules within in the specimen basket, and a specimen securing rod retaining means to fasten each of the specimen retaining rods to the specimen basket.

4 Claims, 4 Drawing Sheets

INTEGRATED CIRCUIT MODULE FIXING METHOD FOR TEMPERATURE CYCLING TEST

BACKGROUND OF THE INVENTION

1. Field Of The Invention

This invention relates to the testing of integrated circuit modules and particularly to the preparation of said integrated circuit modules to be subjected to cycling of temperature over an extreme range.

2. Description of Related Art

In order to determine how well the materials which compose integrated circuit modules will withstand changes in temperature, the integrated circuit modules must be subjected to a temperature cycling test. The integrated circuit modules are placed in a specimen basket and the specimen basket is set in a temperature cycling chamber. The temperature is raised to approximately +150° C. and then lowered to a temperature of approximately −65° C. The rate at which the temperature within the chamber is raised or lowered is dependent upon whether the testing is temperature cycling or a thermal shock. For a temperature cycling test, the temperature is raised or lowered between the +150° C. and the −65° C. in less than 5 minutes. For a thermal shock, the excursion will be in less than 2 minutes.

To accomplish the excursion of temperatures a fluid is used to transmit the temperature to the integrated circuit modules. For temperature cycling the fluid is generally air. For thermal shock a fluorocarbon based liquid with a chemical formula of:

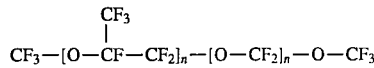

that has a commercial designation of ODO is used as the fluid to transmit the temperature to the integrated circuit modules The equipment used for temperature cycling accepts the integrated circuit modules in specimen baskets. The modules are set in the specimen baskets with no retention. As the baskets are handled and during the testing, the integrated circuit modules may be jostled into one another. When this happens, the leads of the integrated circuit modules may become damaged.

U.S. Pat. No. 5,397,114 (Kitaura) describes a clamping device for fixing an integrated circuit die the setting surface of a lateral injection molding machine so as to fill molding compound around the die to create a finished plastic integrated circuit package.

U.S. Pat. No. 4,714,879 (Krause) discloses a holding and testing device for individual integrated circuit modules to test the functioning and electrical characteristics of said integrated circuit modules.

SUMMARY OF THE INVENTION

An object of this invention is the prevention of damage to integrated circuit modules during preparation for testing, testing, and post-test handling.

This and other objects of the present invention is provided by an integrated circuit module retaining apparatus. The integrated circuit module retaining apparatus has a specimen basket into which integrated circuits are placed. A plurality of specimen retaining rods are placed at intervals across the top of the specimen basket aligning with the integrated circuit modules. A specimen retaining rod securing means secures the specimen retaining rod to the specimen basket. Each specimen retaining rod is coupled to an integrated circuit module by an integrated circuit module retaining means, thus securing the integrated circuit module to the specimen basket.

DETAILED DESCRIPTION OF THE INVENTION

Figure 1:
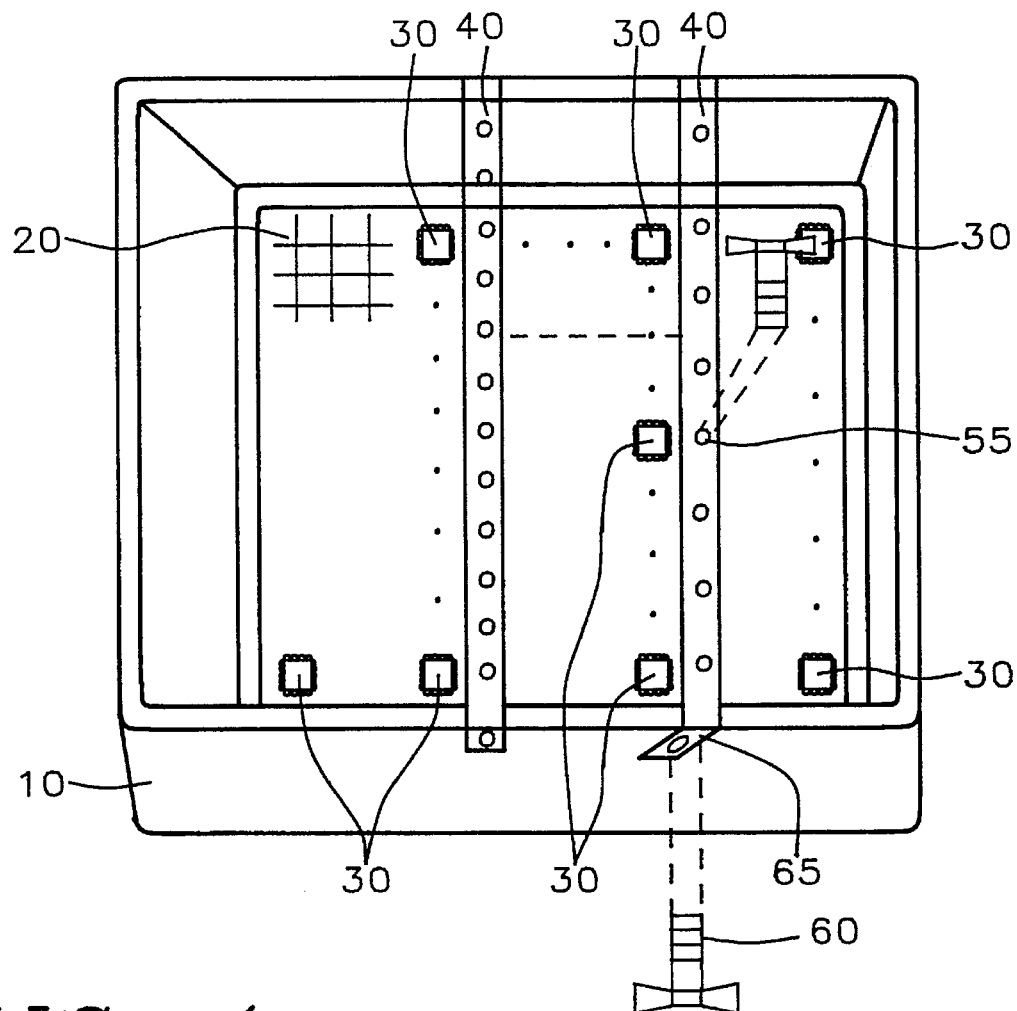
FIG. 1 is a view of a specimen basket for a two axis movement of the preferred embodiment of this invention.

Referring to FIG. 1, a specimen basket 10 whose bottom 20 is a coarse meshed material, contains a plurality of integrated circuit modules 30. The specimen basket 10 is constructed of a materials such as aluminum or stainless steel that is able to endure rapid changes of temperature in a temperature cycling chamber (not shown). The integrated circuit modules 30 are placed evenly across bottom 20 of the specimen basket 10 so as to be in close proximity but not so close as to cause damage to the leads of the integrated circuit modules 30 or to block the flow of fluid circulation from around the integrated circuits modules in the testing chamber.

A plurality of retaining rods 40 are placed over the integrated circuits modules 30. A retaining rod 40 is aligned with a row of integrated circuit modules 30. The threaded screw 60 is placed in the threaded hole 65 in the retaining rod 40 to secure the retaining rod 40 to the specimen basket 10. Another threaded screw 50 is placed in threaded hole 55 and brought in contact with the integrated circuit module 30. This prevents said integrated circuit modules 30 from shifting while the specimen basket is being prepared for and moved to the temperature cycling chamber (not shown).

Figure 2:
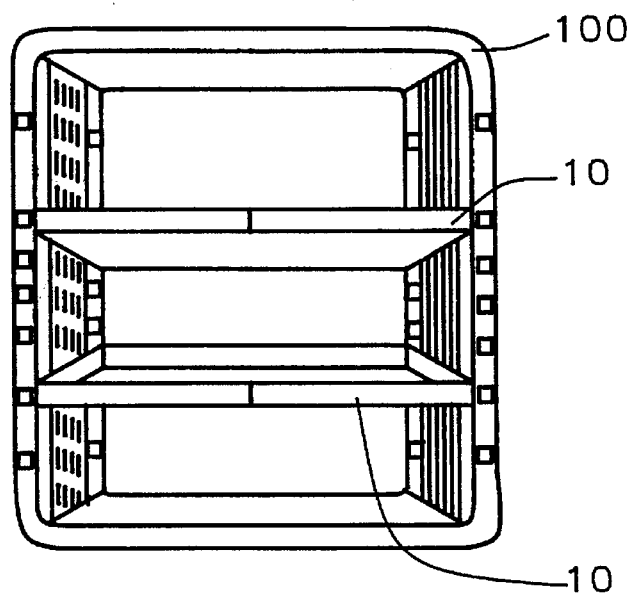
FIG. 2 is a view of the thermal cycling chamber with multiple specimen baskets of FIG. 1 loaded.

FIG. 2 shows a thermal cycling chamber 100. A plurality of specimen baskets 10 are placed within the chamber 100. The chamber 100 is sealed from the external environment. The atmosphere within the chamber is brought to a temperature of approximately +150° C. and held there for a period of approximately 10 minutes. The atmosphere within the chamber is then brought to a temperature of −65° C. for a period of approximately 10 minutes. This cycle is repeated for a large number of iterations. At the conclusion of these iterations, the specimen basket 10 is removed from the chamber 100 and the integrated circuit modules are removed from the specimen basket 10 to be tested for functioning.

When the atmosphere of the chamber 100 is changed from +150° C. to −65° C. or from −65° C. to +150° C. and if the period for this excursion is approximately 5 minutes, the test is termed temperature cycling. However, if the excursion period is less than two minutes and the cooling fluid is a liquid, then the test is termed a thermal shock. Since this change happens so rapidly, any thermally caused failure mechanisms within the integrated circuit modules will be accelerated.

Figure 3:
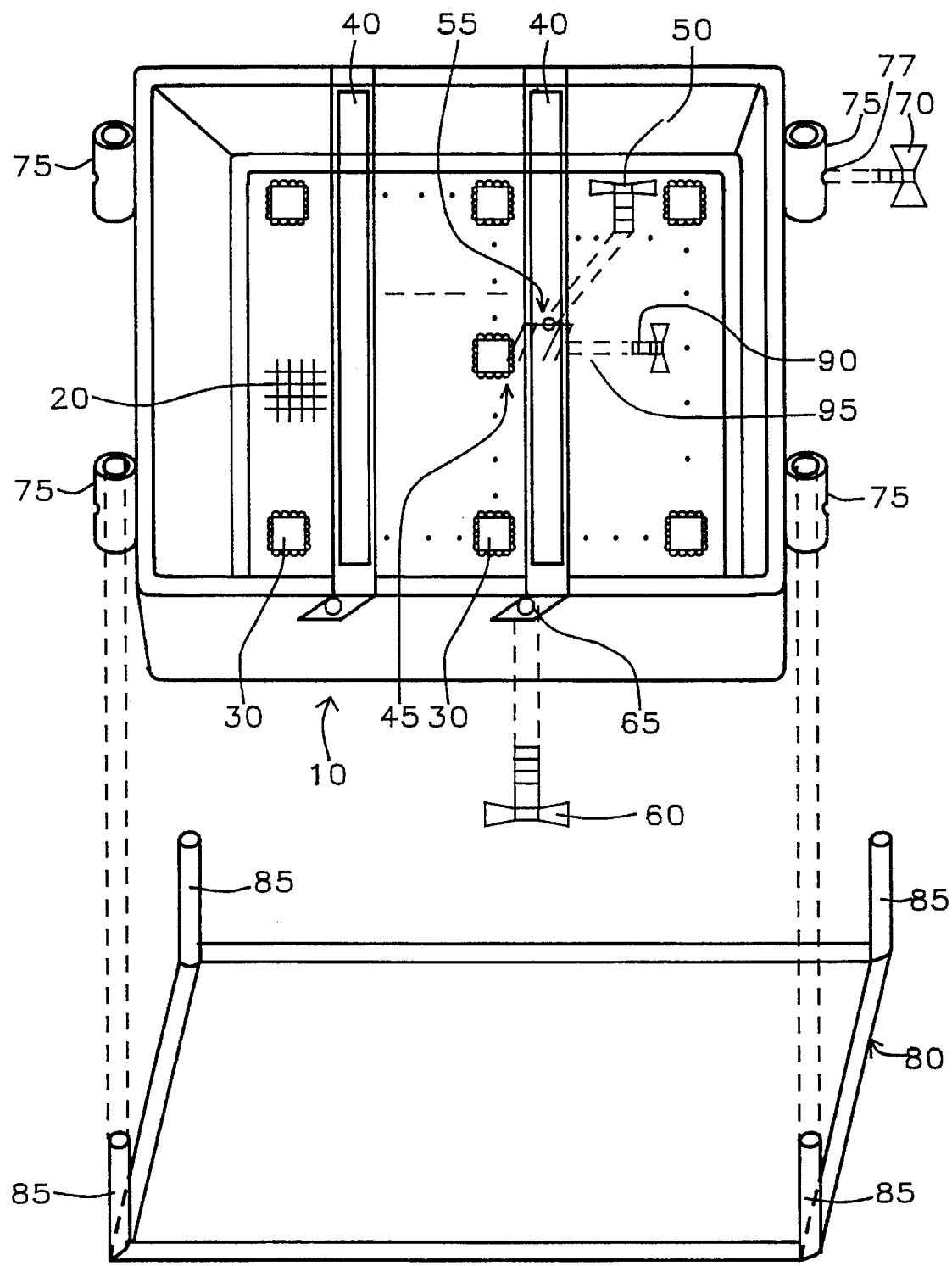
FIG. 3 is a view of a specimen basket for three axis movement of the preferred embodiment of this invention.

The thermal shock testing is often accomplished by submersion of the specimen baskets 10 into a chilled liquid such as liquid ODO as described above. FIG. 3 shows a variation of the preferred embodiment to allow the specimen basket 10 to be transported into the chilled liquid. The specimen basket 10 with the coarse meshed material bottom 20, has the integrated circuit modules 30 placed in it as in FIG. 1. A plurality of retaining rods 40 are place evenly over the integrated circuit modules 30 and secured to the specimen basket 10 by threaded screw 60 into threaded hole 65.

An integrated circuit module retainer is formed by the module retainer 45 and threaded screw 50. The integrated circuit module retainer is positioned over an integrated circuit module 30. Threaded screw 90 is placed in the threaded hole 95 and tightened to secure the integrated circuit module retainer in place. Threaded screw 50 is placed in the threaded hole 55 and adjusted so that the threaded screw 50 are in contact with the integrated circuit module 30 thus preventing movement of the integrated circuit module 30 during preparation for testing, testing, and post-testing handling.

The specimen basket 10 is placed into the bracket 80. Bracket 80 has four posts 85 onto which the four specimen basket adapters 75 are placed. The placement of the height of the specimen basket in the bracket is made and threaded screw 70 is placed in threaded hole 75 and the specimen basket 10 is secured to the bracket 80.

Multiple specimen baskets 10 can be placed in the bracket 80. The bracket is then placed in a thermal chamber which has separate subchambers. The first subchamber will heat the specimen baskets 10 to approximately 150° C. The specimen baskets 10 in the bracket 80 are then transferred to the second subchamber that contains a liquid that is chilled to −65° C. The bracket 80 allows multiple specimen baskets 10 to be moved simultaneously.

Figure 4:
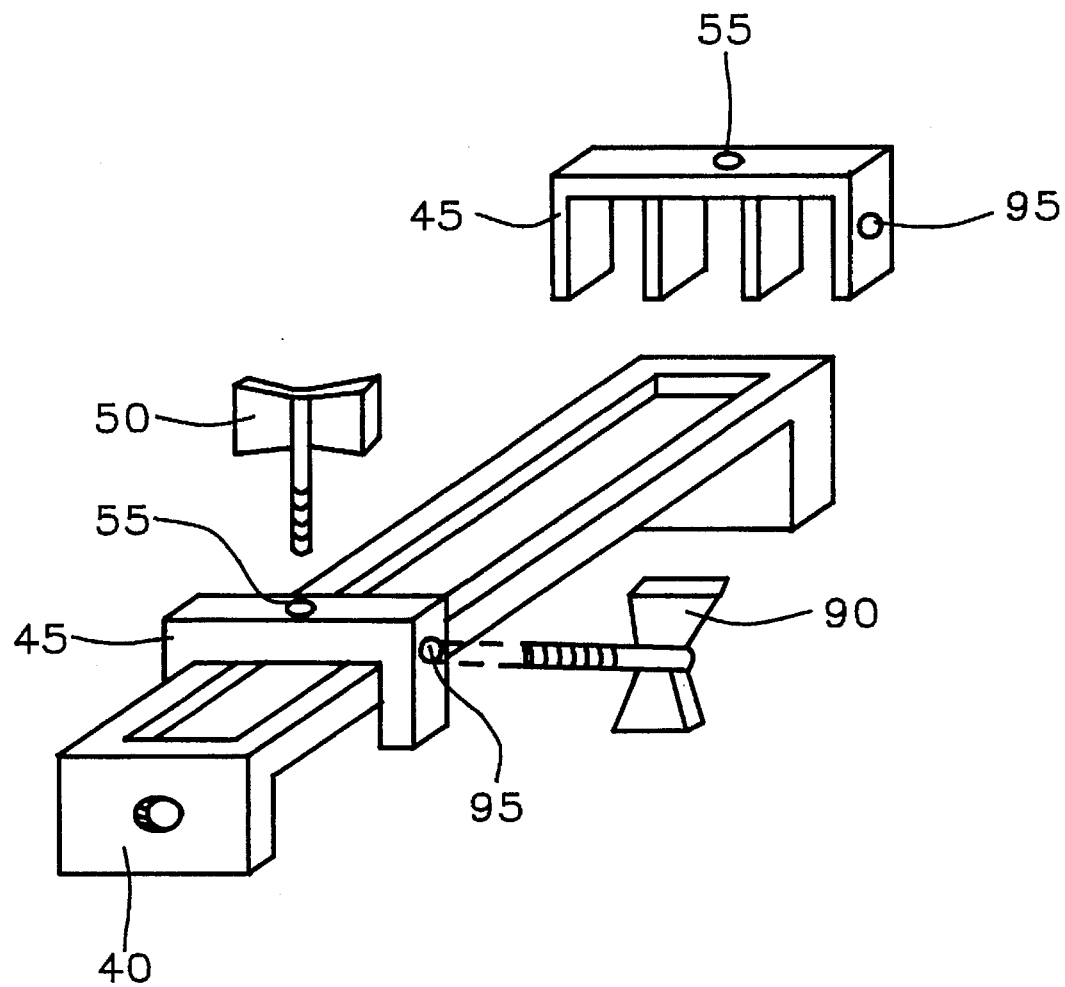
FIG. 4 is a view of a specimen retaining rod with integrated circuit module retaining fixture of a preferred embodiment of this invention.

FIG. 4 shows the retaining rod 40 with the module retainer 45. Module retainer 45 is of a material that can endure the extremes of temperature of the temperature cycling or thermal shock testing. The module retainer 45 is placed on the retainer rod 40 and secured to the retainer rod 40 by placing threaded screw 90 in the threaded hole 95. Threaded screw 50 is placed in the threaded hole 55 and adjusted so that is in contact with the integrated circuit module (30 of FIG. 3).

Figure 5:
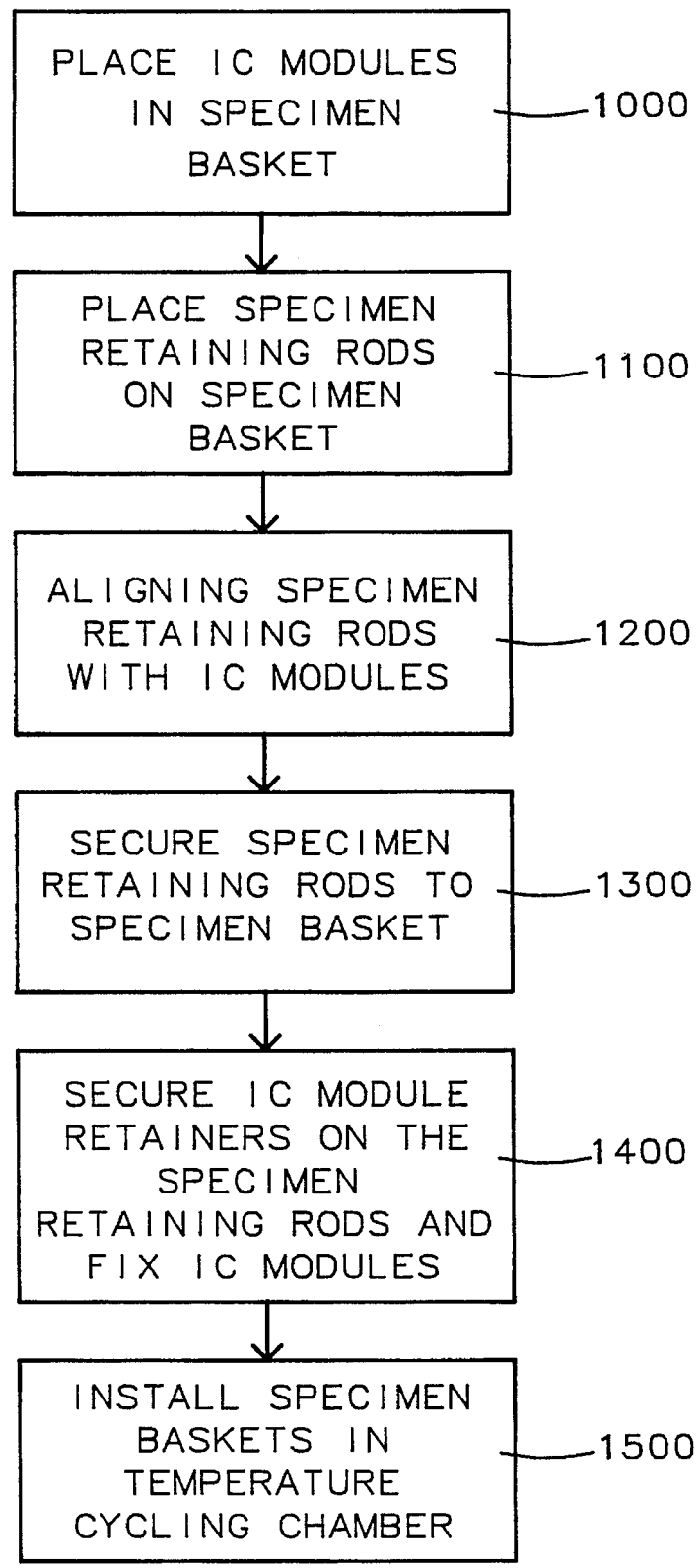
FIG. 5 is a flow chart of the method for the retention of integrated circuit modules for temperature cycling testing.

A method of for securing integrated circuit modules within a specimen basket is shown in FIG. 5. Integrated circuit modules are placed in the bottom of the specimen basket 1000. The retaining rods are placed on the specimen basket 1200 and then aligned so that each rod aligns with a row of the integrated circuit modules 1300. The module retainers are then adjusted to secure the integrated circuit modules in place within the specimen basket 1400. The specimen basket is then installed into the temperature cycling chamber 1500.

While the invention has been particularly shown and described with reference to the preferred embodiments thereof, it will be understood by those skilled in the art that various changes in form and details may be made without departing from the spirit and scope of the invention.

What is claimed is:

1. A method for the fixing of a plurality of integrated circuit modules to prevent damage to said plurality of integrated circuit modules during handling prior to placement in, during testing in, and during handling after removal from a temperature cycling chamber for a cycling of temperature of said plurality of integrated circuit modules from a first temperature to a second temperature and from the second temperature to the first temperature for a plurality of iterations, comprising the steps of:

a) placing the plurality of integrated circuit modules within a specimen basket;

b) setting a plurality of specimen retaining rods upon the specimen basket c) aligning each of the plurality of specimen retaining rods with a row of the plurality of integrated circuit modules;

d) securing the plurality of specimen retaining rods to the specimen basket with a specimen retaining rod securing means;

e) adjusting each of a plurality of integrated circuit module retaining means so as to couple the plurality specimen retaining rods to the plurality the integrated circuit modules thus fixing said plurality of integrated circuit modules from movement within the specimen basket; and f) installing the specimen basket within the temperature cycling chamber.

2. The method of claim 1 wherein the specimen basket, the plurality of specimen retaining rods, the specimen retaining rod securing means, and the integrated circuit module retaining means are of a material that has an ability to endure the cycling of the temperature.

3. The method of claim 1 wherein temperature cycling said chamber for the cycling of temperature performs temperature cycling if air is used as a temperature transmitting medium.

4. The method of claim 1 wherein temperature cycling said chamber for the cycling of temperature performs thermal shock if liquid is used as a temperature transmitting medium.

* * * * *